United States Patent [19]
Dousse

[11] Patent Number: 4,751,846
[45] Date of Patent: Jun. 21, 1988

[54] REDUCING NOISE IN ULTRASONIC IMAGES

[75] Inventor: Bruno Dousse, Basel, Switzerland

[73] Assignee: Kontron Holding A.G., Zurich, Switzerland

[21] Appl. No.: 915,284

[22] Filed: Oct. 3, 1986

[30] Foreign Application Priority Data

Oct. 16, 1985 [CH] Switzerland ............... 4456/85

[51] Int. Cl.$^4$ .................. G01N 29/00; H04N 5/213
[52] U.S. Cl. .............................. 73/602; 358/112; 364/724
[58] Field of Search ............ 73/602, 626; 128/660; 358/112, 167; 364/414, 724

[56] References Cited

U.S. PATENT DOCUMENTS

| | | | |
|---|---|---|---|
| 4,058,001 | 11/1977 | Waxman | 358/112 |
| 4,212,072 | 7/1980 | Huelsman et al. | 358/112 |
| 4,240,106 | 12/1980 | Michael et al. | 358/36 |
| 4,319,489 | 3/1982 | Yamaguchi et al. | 73/626 |
| 4,375,671 | 3/1983 | Engle | 367/11 |
| 4,445,379 | 5/1984 | Yamaguchi et al. | 73/631 |
| 4,607,284 | 8/1986 | Raven et al. | 358/167 |
| 4,667,240 | 5/1987 | Willis et al. | 358/167 |

FOREIGN PATENT DOCUMENTS

| | | | |
|---|---|---|---|
| 0004728 | 10/1979 | European Pat. Off. | |
| 2747405 | 8/1978 | Fed. Rep. of Germany | 358/112 |
| 2015847 | 9/1979 | United Kingdom | |

OTHER PUBLICATIONS

*Electronics*, Oct. 26, 1970, "Programmable Digital Filter Performs Multiple Functions", Anderson, A. T.

*IEEE Trans. on Aerospace and Electronic Sys.*, vol. AES-12, No. 6, Nov. 1976, "Mean Level Detection Utilizing a Digital First-Order Recursive Filter", Dillard, G. M.

*IEEE Trans. on Acoustics, Speech, and Signal Processing*, vol. ASSP-27, No. 1, Feb. 1979, "Variable Digital Filters Having a Recursive Structure", Johnson, D. H.

*IEEE Trans on Consumer Electronics*, vol. CE 25, Aug. 1979, "A Digitalized Automatic Ghost Canceller", Murakami, J., Ohzeki, K., and Ogi, K.

*Proceedings of the IEEE*, vol. 67, No. 4, Apr. 1979, "Digital Scan Converters in Diagnostic Ultrasound Imaging", Ophir, J. and Maklad, N. F.

Dennis, T., IEEE Proc., vol. 127, Pt. G. No. 2, "Nonlinear Temporal Filter for Television Picture Noise Reduction", (Apr. 1980).

Elliott et al., IEEE Proc., vol. 122, No. 2, "Hardware Implementation of a Recursive Digital Filter for M.T.I. Radar", (Feb. 1975).

McMann et al., SMPTE Journal, vol. 87, No. 3, "A Digital Noise Reducer for Encoded NTSC Signals", (Mar. 1978).

Schueler et al., IEEE Transactions on Sonics and Ultrasonics, vol. SU-31,-No. 4, "Fundamentals of Digital Ultrasonic Imaging", (Jul. 1984).

*Primary Examiner*—Stewart J. Levy
*Assistant Examiner*—Lawrence G. Fess
*Attorney, Agent, or Firm*—Jon S. Saxe; Bernard S. Leon; George W. Johnston

[57] ABSTRACT

Techniques are disclosed for producing improved ultrasonic cross-sectional images of a body subject to a number of consecutive and at least partly overlapping scans by the pulse echo method to produce digital image signals corresponding to the received echoes. The illustrated systems includes an ultrasonic transducer scanner energized by a transmitter, and a receiver configuration which processes the received echo signals for display on a TV monitor. To reduce the image-quality-limiting noise while retaining a satisfactory representation of moving parts in the zone under examination, image signals corresponding to corresponding scanning dots of consecutive scans are combined in the receiver circuit which utilizes time-discrete non-linear filtering with filter coefficients which vary as a function of the filter input signal. This arrangement and the related process produce improved images.

2 Claims, 8 Drawing Sheets

REDUCING NOISE IN ULTRASONIC IMAGES

BACKGROUND OF THE INVENTION

1. Field of the Invention

The invention relates to techniques and systems for producing ultrasonic cross-sectional images of a body, wherein a number of consecutive and at least partly overlapping scans of the body are made by the pulse echo method in one scanning plane to produce digital image signals corresponding to the received echoes. Each scan comprises a predetermined number of scanning lines; each such line comprises a predetermined number of scanning dots and there is a predetermined time interval between corresponding dots of consecutive scans.

2. Description

It is known (IEEE Transactions on Sonics and Ultrasonics, Vol. SU-31, No. 4, July 1984, pp. 195–217) that noise which impairs image quality in such systems can be reduced by averaging the image signals over a sequence of images; unfortunately, movements in the zone under examination cause blurring of the resulting image. This is a considerable disadvantage, particularly in medical ultrasonic diagnosis.

It is therefore an object of the invention to obviate this disadvantage.

SUMMARY OF THE INVENTION

For this purpose, the method according to the invention comprises:

combining, for at least some of the dots of a displayed cross-sectional image, image signals corresponding to corresponding scanning dots of consecutive scans to produce a combined image signal corresponding to each of the displayed image dots, the combining process including time-discrete non-linear filtering of said image signals in accordance with filter coefficients which vary as a function of the amplitude of the filter input signal.

The invention also relates to an image signal processing unit for use in a system which implements such techniques. The system comprises an ultrasonic scanner; a transmitter connected thereto; a receiver connected to the ultrsonic scanner; a television monitor connected to the receiver; and a control unit connected to the transmitter, to the receiver and to the television monitor.

The receiver comprises a detector circuit for producing an analog output signal representing the received echo together with the image signal processing unit. The latter according to the invention is characterized in that (a) it is connected to be responsive to the output of the detector circuit and comprises: an analog-to-digital converter connected to be responsive to the output of the detector circuit; a digital image memory connected to be responsive to the output of the converter; a digital-to-analog converter connected to be responsive to the output of the image memory; and a non-linear digital filter;

(b) the filter is interposed between the analog-to-digital converter and the digital-to-analog converter and comprises at least one delay element for delaying the filter input signal for a period equal to the predetermined time interval between corresponding scanning dots of consecutive scans, and (c) each of the filter coefficients is variable in dependence on the amplitude of the input signal of the filter.

The invention is also directed to the system which includes the above defined image signal processing unit.

The main advantages provided by the invention are that noise is reduced considerably, but movements in the zone under examination do not cause blurring of the resulting displayed image. The invention therefore makes it possible to produce readily recognizable ultrasonic images of moving organs or organ parts such as heart valves, and to improve the quality of such images by noise reduction. Another advantage of the invention is that it can be embodied with a relatively low outlay on circuitry.

BRIEF DESCRIPTION OF THE DRAWINGS

Other features and advantages of the invention will become apparent from the following description of embodiments made with reference to the accompanying drawings wherein.

DETAILED DESCRIPTION

Figure 1:
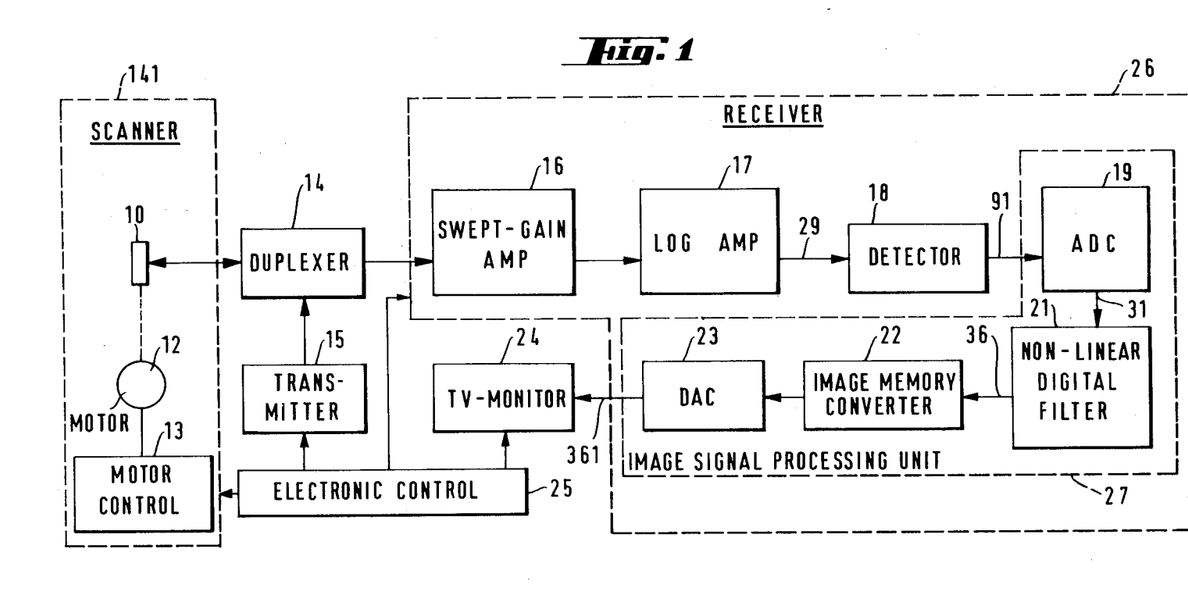
FIG. 1 is a block schematic diagram of an ultrsonic imaging system according to the invention and comprising a sector scanner.

FIG. 1 is a block schematic diagram of an ultrasonic imaging system for performing the method according to the invention.

As shown in FIG. 1, a pulsed transmitter 15 controls by way of a duplexer 14 an ultrasonic transducer 10 of a scanner 141, in the form of a mechanical sector scanner. The received echo signal passes through the duplexer 14 to the input of a receiver 26 where it is applied to the swept-gain amplifier 16. The output of amplifier 16 is also applied to a logarithmic amplifier 17 which outputs a signal proportional over a predetermined range to the logarithm of its input signal. The output of the logarithmic amplifier 17 is connected by a line 29 to the input of a detector 18.

Detector 18 is operative to produce, for example, a detection and a low-pass filtering of the output signal of the logarithmic amplifier 17. Detector 18 outputs the resultant signal by way of a line 91 to analog-to-digital converter 19 in the image signal processing unit 27. The digital output signal of the converter 19 is supplied via a bus 31 to the input of a non-linear digital filter 21. The filter in turn outputs the filtered signal by way of a bus 36 to image memory/converter 22 where the filtered signal is stored and then read out to a digital-to-analog converter 23. The latter provides digital-to-analog conversion of the read-out signal and supplies the result as a standard television signal to a monitor 24.

The ultrasonic transducer 10 is driven by a motor 12 controlled by a motor control 13. An electronic control circuit 25 issues control and synchronizing signals to all of the other blocks shown in FIG. 1.

Figure 2:
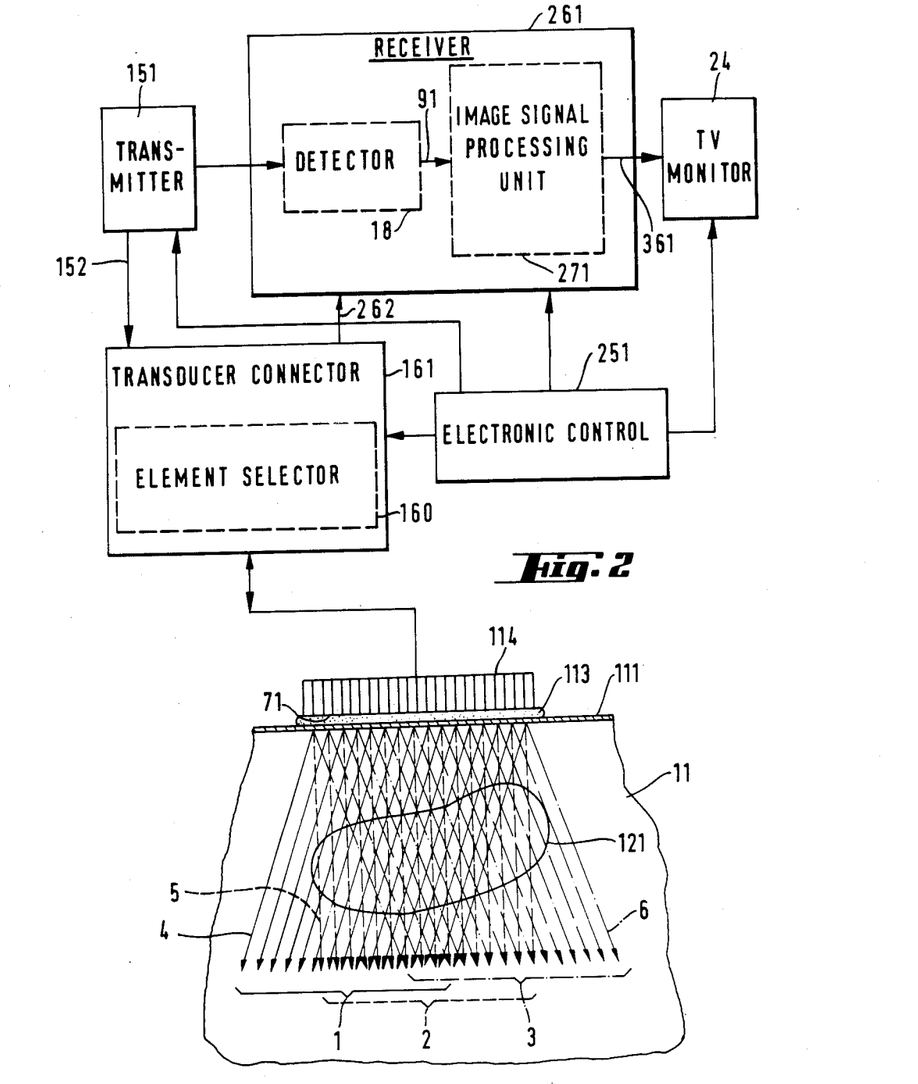
FIG. 2 is a block schematic diagram of an ultrasonic imaging system according to the invention and comprising a compound scanner.

The method according to the invention is also of use for ultrasonic imaging in which the scanning patterns only partly overlap. The method according to the invention can therefore be performed with the ultrasonic imaging system whose block schematic diagram is shown in FIG. 2. This system operates with an electronic compound scanner.

The system shown in FIG. 2 comprises an ultrasonic transducer array 114, a transducer connector 161, a transmitter 151, a receiver 261, a television monitor 24 and a control unit 251.

The transducer array 114 comprises a longitudinal array of adjacent transducer elements. The array 114 can have a flat radiation surface 71. Preferably, however, its radiation surface is curved to focus the ultrasonic waves in a plane perpendicular to the scanning plane.

The system shown in FIG. 2 operates with a segmented transducer array 114 with selected groups of discrete transducer elements being successively actuated so that a number of scans can be performed at various directional angles. Accordingly, the transducer connector 161 comprises an element selector 160 enabling any element of the arrangement 114 to be selected for connection to an appropriate terminal of the transmitter 151.

The transducer connector 161 is connected by way of bus 152, 262 to the transmitter 151 and to the receiver 261, respectively.

The receiver 261 is of similar construction to the receiver 26 of FIG. 1 but has in addition means (not shown) for adding the echo signals from the various converter elements to form a resulting echo signal. The receiver 261 comprises inter alia a director circuit 18 like that of the receiver 26 and an image signal processing unit 271 which will be described hereinafter in detail with reference to FIG. 3.

The output signal of the detector circuit 18 is coupled via line 91 to the input of the image signal processing unit 271. The image signals at the output thereof are supplied via a line 361 to the television monitor 24.

The control unit 251 comprises the necessary means for controlling the operation of all the blocks shown in FIG. 2.

The bottom region of FIG. 2 shows in diagrammatic form how the imaging system shown in FIG. 2 is used to examine a part 11 of a patient's body. As FIG. 2 shows, the transducer array 114 is placed on the skin 111 of the body part 11 to be examined, a transmission gel 113 being interposed between the radiating surface of the array 114 and the patient's skin.

The imaging system shown in FIG. 2 is so operated that the arrangement 114 makes at least two different and partly overlapping scans by the pulse echo method in the scanning plane in order to produce a compound cross-sectional picture, e.g., of an internal organ 121. For example, three consecutive scans 1, 2, 3 are made rapidly and for each scan, groups of transducer elements of the array 114 are used in rapid sequence, transmitting the ultrasonic pulses in a particular direction and receiving the corresponding echoes. The part of the patient's body under examination is therefore irradiated with a rapid sequence of parallel ultrasonic beams during each scan 1, 2, 3.

In FIG. 2 the corresponding beams 4, 5, 6 for each of the scans 1, 2, 3 respectively (such beams also being called scanning lines herein) are shown by different lines.

The illustrated method enables the body part under examination to be irradiated very quickly with a compound scanning pattern.

The transmission signals for the transducer elements of the array 114 are produced in the transmitter 151 and the echo signals delivered by the transducer elements are coupled via line 262 to the receiver 261. After processing in detector 18, the received echo signals are supplied by way of the line 91 to the image signal processing unit 271.

The various scans 1, 2, 3 shown in FIG. 2 create individual images. The image signal processing unit 271 to be described in detail hereinafter is operative inter alia to produce an electronic compounding—i.e., the compounding of these individual images—to produce a compound image.

Figure 3:
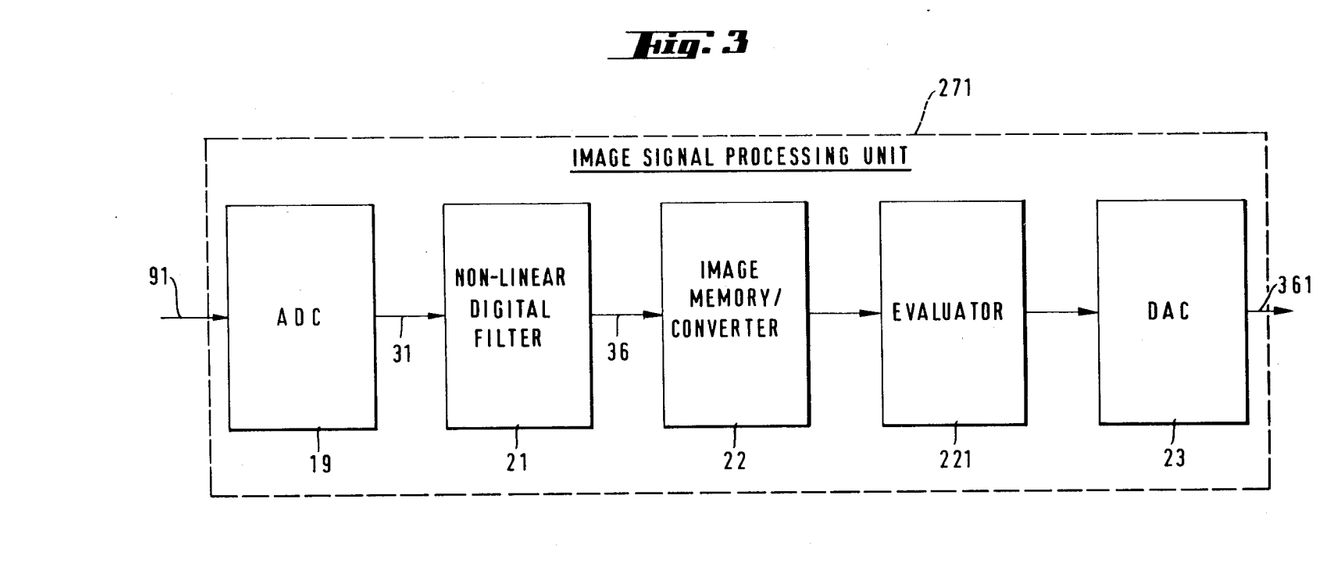
FIG. 3 is a block schematic diagram of the image signal processing unit 271 shown in FIG. 2.

As FIG. 3 shows by means of a block schematic diagram, the unit 271 of FIG. 2 comprises the same stages 19, 21, 22 and 23 as the unit 27 of FIG. 1 plus an evaluation unit 221 between the image memory/standard converter 22 and the digital-to-analog converter 23. The function of the unit 221 is to combine the image signals read out of the image memory/converter 22 to produce the compound image, for example, by averaging the image signals.

The output signal of the processing unit 271 is fed via a line 361 to the television monitor 24. The monitor therefore displays a compound image—i.e., an image produced by the electronic combination of discrete images as described above.

Of particular concern in the present invention is the construction of the processing units 27 of FIG. 1 and 271 of FIGS. 2 and 3. These processors include a nonlinear digital filter circuit which is disposed between the analog-to-digital converter 19 and the digital-to-analog converter 23. Further, the coefficients of the filter 21 are variable in dependence on the amplitude of the filter input signal. While the filter 21 of FIGS. 1–3 is disposed between the ADC converter 19 and the image memory/converter 22, it alternatively can be connected to the output of the memory/converter unit 22 in FIG. 1 or FIG. 2, or can be connected to the output of the evaluator unit 221 of FIG. 3, provided the filter coefficients are determined taking into account the relative position of the filter.

Figure 4:
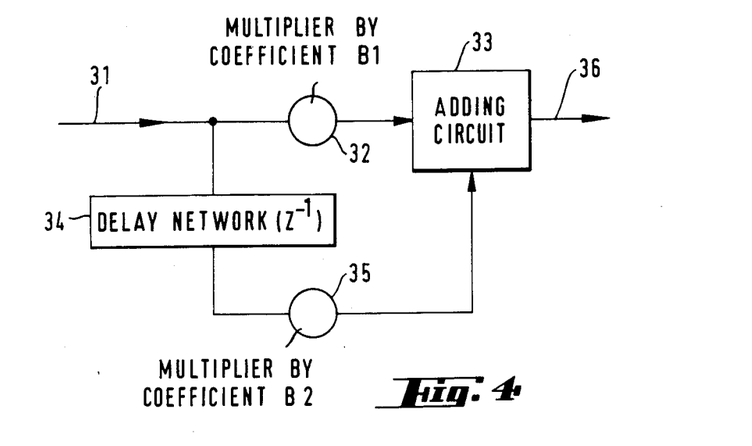
FIG. 4 shows the basic circuit diagram of a first embodiment of the filter 21 shown in FIGS. 1 and 3.

FIG. 4 shows the basic circuit diagram of a first embodiment of the filter 21. The same is a first-order transverse filter and comprises a delay network 34, coefficient multipliers 32, 35 and an adder 33. The signals applied to the filter are received from the analog-to-digital converter 19 via the bus 31. The filtered output signal is supplied to succeeding stages via a line 36.

The coefficient multiplier 32 introduces a coefficient B1 and the coefficient multiplier 35 introduces a coefficient B2.

The delay network 34 delays the filter input signal for a time equal to the predetermined time interval between corresponding scanning dots of consecutive scans.

The multipliers 32, 35 are so devised that each of the filter coefficients B1, B2 is variable in dependence on the amplitude of the input signal of the filter.

Figure 6:
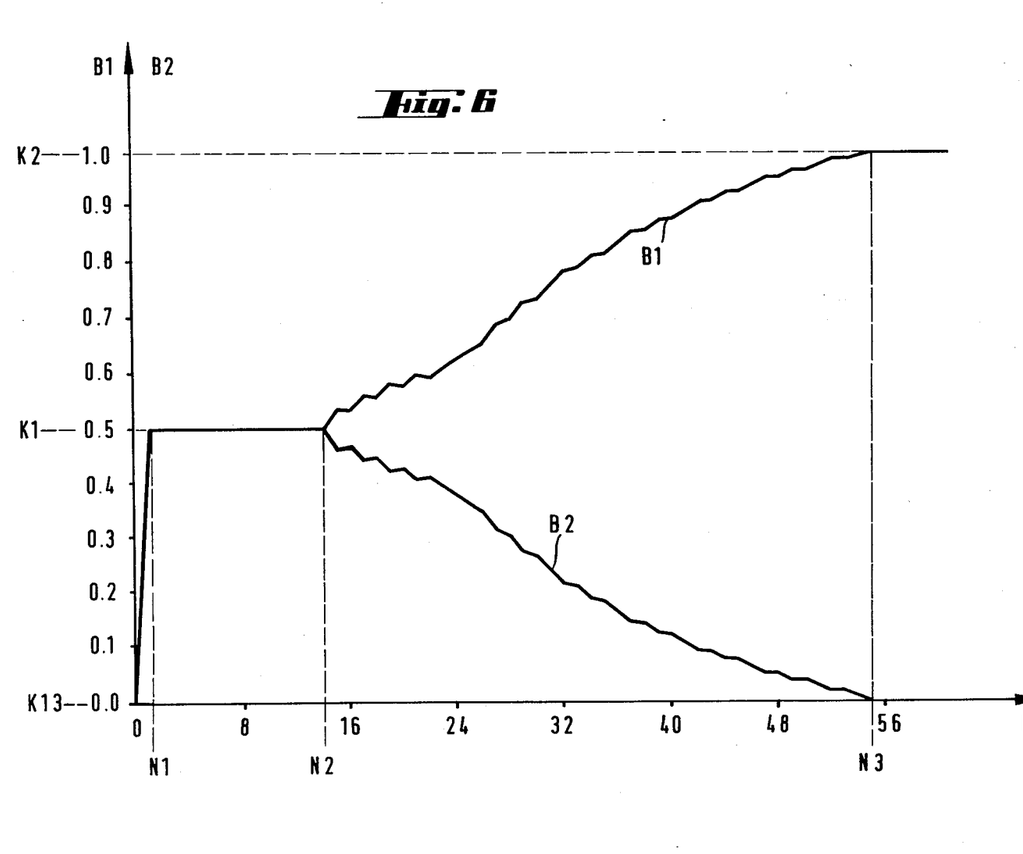
FIG. 6 is a diagram of the filter coefficients for a first embodiment of the filter 21 shown in FIG. 4.

FIG. 6 diagrammatically illustrates the variation of the filter coefficients B1, B2 in dependenace on the amplitude N of the filter input signal.

The amplitude values N vary between N=0, corresponding to a black dot of the television display, and a value N=63 corresponding to a white dot of the display.

As illustrated in FIG. 6, the filter coefficients B1, B2 are defined by the following functions of the amplitude N of the filter input signal:

(1) for relatively low values of N in a range from N1 to N2, B1=B2=K1;

(2) for medium values of N in a range between N2 and N3; B1 increases from B1=K1 with increasing N and equals K2 when N=N3; B2 decreases from B2=K1 with increasing N and equals K13 when N=N3;

(3) for relatively high values of N equal to or greater than N3, B1=K2 and B2=K13;

(4) N1, N2 and N3 are predetermined values of the amplitude N of the input signals and K1, K2 and K13 are fixed values (constants).

In the example according to FIG. 6, K1=0.5, K2=1.00 and K13=0. In general, other values of K1, K2 and K13 can be used. Preferably, however, the pattern of B1 plotted against B2 is at least substantially the same as shown in FIG. 6.

In the circuit of FIG. 4 each of the multipliers 32, 35 is, for example, a PROM while the delay network 34 is illustratively an image memory operated as a digital delay line.

When the filter 21 embodies the circuit of FIG. 4 and operates with the filter coefficients of FIG. 6, there is a non-linear filtering of the input signals such that input signals of relatively low amplitude are averaged over two consecutive images, whereas input signals of relatively large amplitude are not averaged at all and go directly to the filter output. In this way the following effects are achieved:

(1) There is no blurring of the displayed image caused by averaging of relatively large amplitude echo signals.

(2) The imaging of movements, which are usually represented by relatively large echo signals, is better than can be provided by known systems in which linear filtering of the echo signals leads to an averaging of all echo signals irrespecitve of their amplitude.

(3) Averaging of echo signals of relatively low amplitude improves the signal-to-noise ratio of the resulting image as compared with known systems in which no action is taken to improve this ratio.

A second embodiment of the filter 21 also employs the circuit arrangement of FIG. 4 but operates with different filter coefficients. An example of the variation of these coefficients in dependence on the amplitude N of the filter input signal can be gathered from the diagram shown in FIG. 7, in which the values of N also lie between the previously defined extremes of N=0 and N=63.

Figure 7:
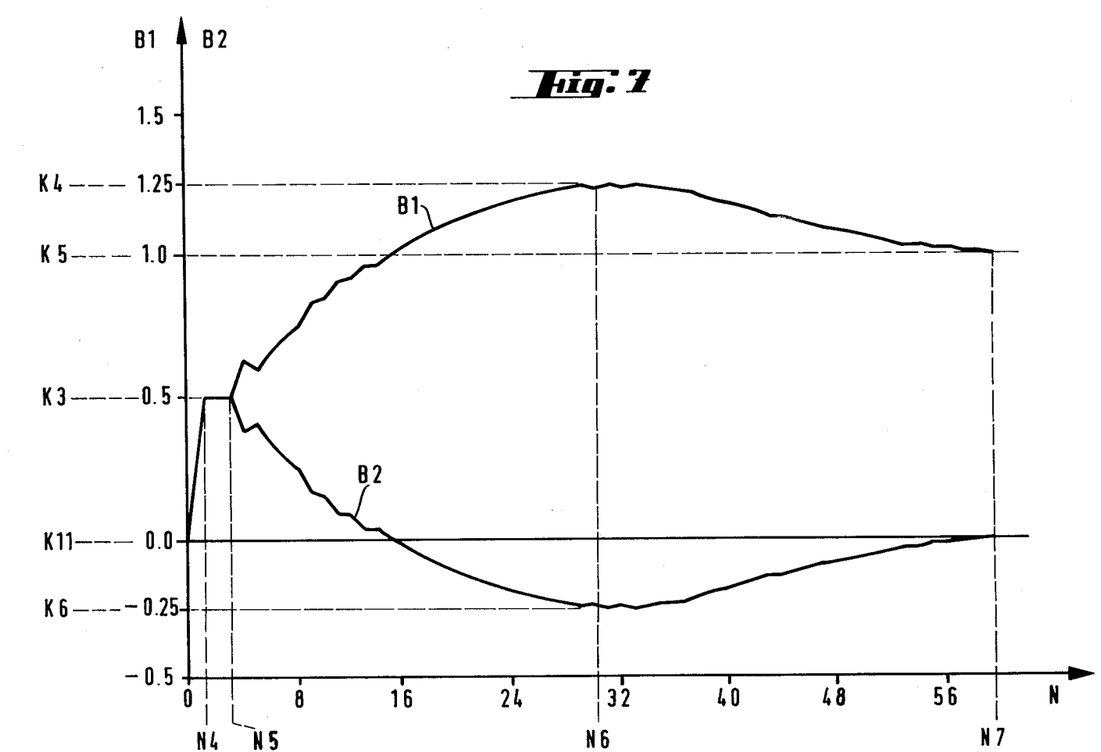
FIG. 7 is a diagram of the filter coefficients for a second embodiment of the filter 21 shown in FIG. 4.

Referring to FIG. 7, the filter coefficients B1, B2 are defined by the following functions of filter input signal amplitude:

(1) for relatively very low values of N in a range from N4 to N5, B1=B2=K3;

(2) for relatively low and medium values of N in range between N5 and N7: B1 increases from B1=K3 with increasing N to reach a maximum B1=K4 when N=N6, thereafter decreasing with increasing N to equal K5 when N=N7. Coefficient B2 decreases from B2=K3 with increasing N until reaching a minimum value B2=K6 when N=N6, B2=K6 being less than zero. then increases with increasing N to equal K11 when N=N7, K11 being equal to or less than zero;

(3) for relatively high values of N equal to or greater than N7, B1=K5 and B2=K11;

(4) N4, N5, N6 and N7 are predetermined values of the amplitude N of the input signal and K3, K4, K5, K6 and K11 are fixed values.

In the example shown in FIG. 7, K3=0.5, K4=1.25, K5=1.00, K6=−0.25 and K11=0. In general, other values of K3, K4, K5, K6 and K7 can be used subject to being less than zero and K11 being equal to or less than zero. Preferably, however, the pattern of B1 plotted against B2 is at least substantially as shown in FIG. 7.

This second embodiment of the filter 21—i.e., the embodiment using the circuit arrangement of FIG. 7—, in addition to producing the previously noted effects achieved by the first embodiment as shown in FIGS. 4 and 6, emphasizes the input signals corresponding to movements in the zone under examination. The second embodiment of the filter 21 therefore also serves the purpose of a moving target indicator.

The filter embodiments hereinbefore described suffice to average filter input signals over at most 2 images. This limit can be exceeded by a recursive filter circuit arrangement of the kind shown in FIG. 5 if the latter operates with filter coefficients A, B1 and B2 which vary, for example, as a function of input amplitude N in accordance with the diagram shown in FIG. 8.

Figure 5:
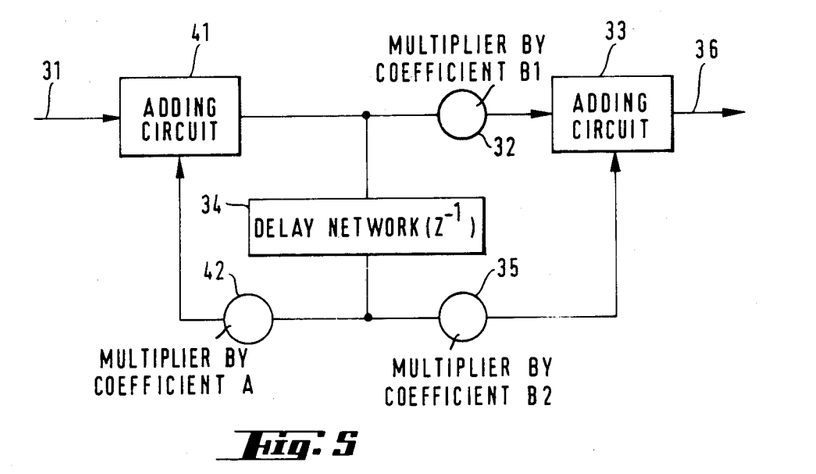
FIG. 5 shows the basic circuit diagram of a second embodiment of the filter 21 shown in FIGS. 1 and 3.

The filter circuit arrangement of FIG. 5 has a first-order canonic structure. It differs from that of FIG. 4 in that the FIG. 5 filter has a feedback path in which a coefficient A is introduced by means of a coefficient multiplier 42, and in that the signal thus fed back and the filter input signal are added together by means of an adder 41.

Figure 8:
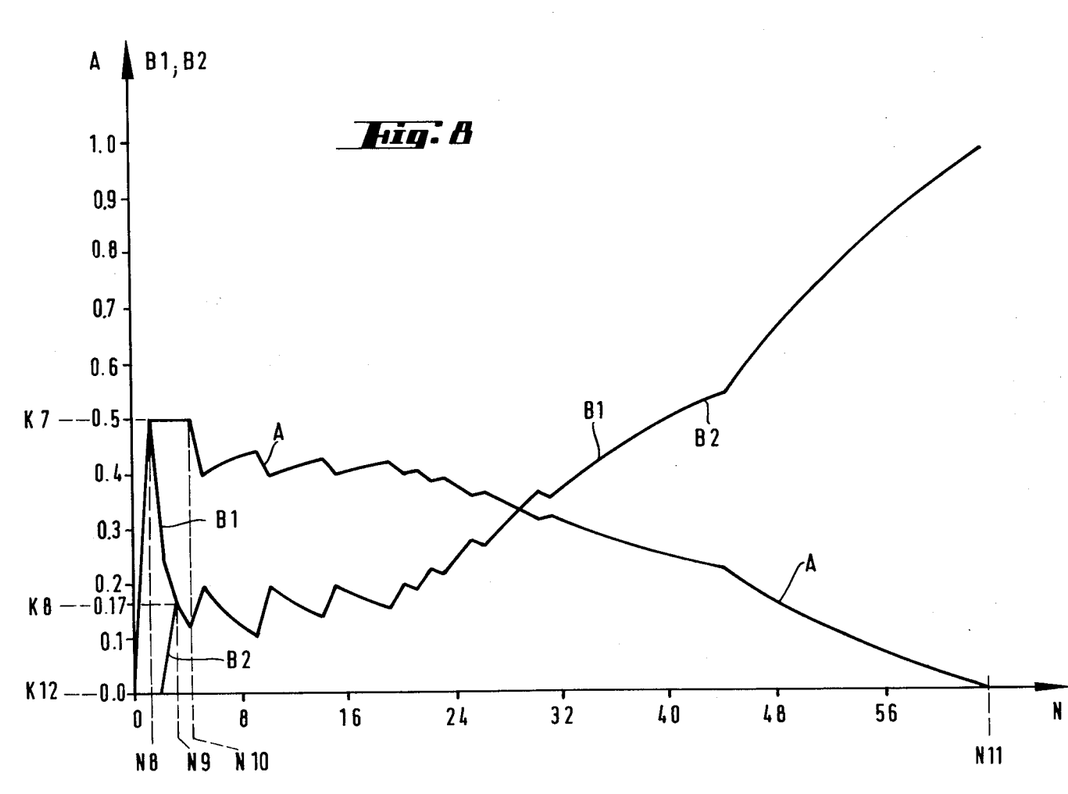
FIG. 8 is a diagram of the filter coefficients for an embodiment of the filter 21 shown in FIG. 5.

As illustrated in FIG. 8, the filter coefficients A, B1 and B2 are defined by the following functions of the amplitude N of the filter input signal;

(1) for relatively very low values of N in a range from N8 to N10, A=K7;

(2) for relatively low and medium values of N in a range between N10 and N11;

Coefficient A fluctuates but gradually decreases with increasing N from A=K7 until it equals K12 when N=N11, K12 being equal to or greater than zero;

(3) for relatively very low values of N in a range between N8 and N9 and for increasing values of N, B1 decreases from B1=K7 and B2 increases from B2=0 until B1 and B2 are both equal to K8 when N=N9;

(4) for values of N equal to or greater than N9, B1=B2, these coefficients vary fluctuatingly but gradually increase with increasing N;

(5) N8, N9, N10 and N11 are predetermined values of the amplitude N of the input signal and K7, K8 and K12 are fixed values.

In the diagram of FIG. 8 too, the values of N lie between the previously defined extremes of N=0 and N=63.

In the example of FIG. 8, K7=0.5, K8=0.17 and K12=0. In general K7, K8 and K12 can have other values subject to K7 being greater than K8, K8 being greater than K12 and K12 being equal to or greater than zero. Preferably, the pattern of each of the coefficients A, B1 and B2 plotted against the pattern of the other two coefficients is at least substantially as shown in FIG. 8.

There are two further aspects to be considered in determining the values of the coefficients A, B1 and B2 of the filter of FIG. 5.

As a rule, filtering should not alter the halftone distribution of a static image—i.e., filtering should not cause compression of the image signals. To meet this requirement, the transfer function H (z) of the filter must be H (z)=1 for z=1. A recursive filter having a first-order canonic structure must therefore meet the following requirement:

$$H(z) = (B1 + B2 \cdot z^{-1})/(1 - A \cdot z^{-1}) = 1 \text{ for } z = 1 \qquad (I)$$

This leads to the condition:

$$(B1 + B2)/(1 - A) = 1 \qquad (II)$$

Condition (II) also applies to the previous embodiments having the filter circuit as shown in FIG. 4.

In the event of the echo signals being compressed, the unity term on the right of equation (II) must be replaced by a function of the amplitude N that corresponds to the compression.

Also, the filter coefficients must be such that the filter is stable. Since the function A(N).N is not monotonous, oscillations occur at the input (and output) of the delay network 34 at certain values of the filter input signal. Computer simulation can be used to determine the function A(N).N so the frequency of such oscillations is half the image frequency. In this event there are only two possible states for any input signal value causing such oscillations. Consequently, it is sufficient for determining coefficients B1 and B2 to comply with the equation:

$$B1(N) = B2(N) \qquad (III)$$

to ensure that these oscillations cancel one another out by addition and do not appear at the filter output.

Taking into account equations (I) to (III), the filter coefficients are determined as follows:

A function A(N) is first selected. The values of coefficient A thus selected are then used to determine the coefficients B1 and B2 with reference to equations (II) and (III). A check is then made to see whether the step response of the filter is stable for each value of the input signal amplitude N—i.e. for each group of values of the coefficients A, B1 and B2 which corresponds to such a value of N—and whether the filter does not effect the half-tone distribution of a static image. If this is not the case, the procedure just described must be repeated with a different function A(N), and so on.

The third embodiment illustrated in FIGS. 5 and 8 provides the following advantages over the first and second embodiments: an even better signal-to-noise ratio is provided in association with a satisfactory and clearly recognizable illustration of movements in the zone under examination.

Figure 9:
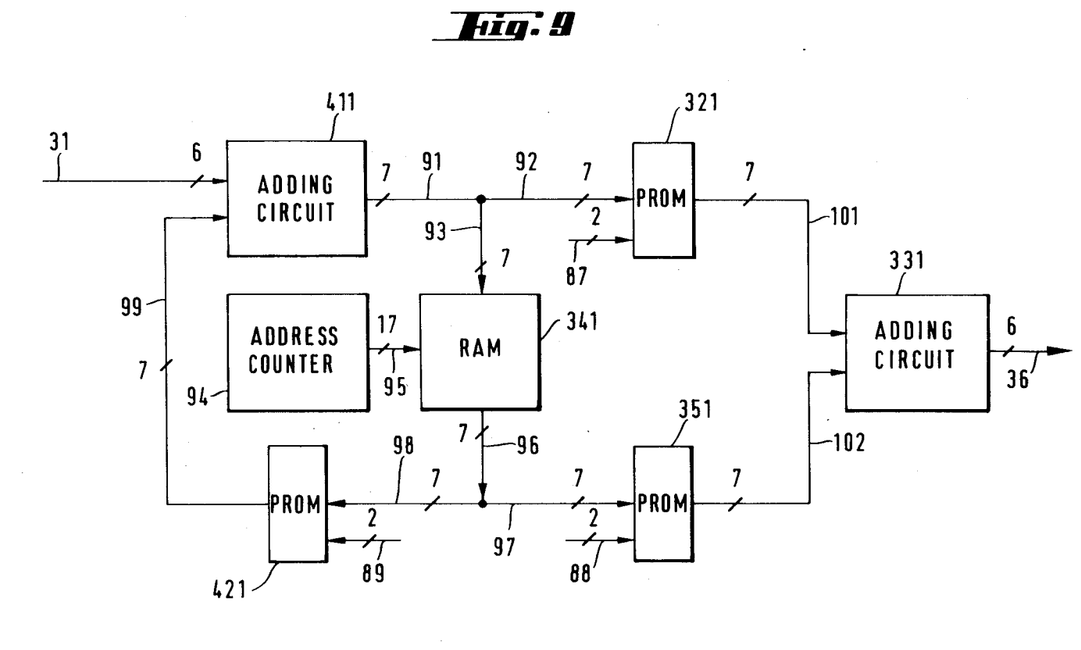
FIG. 9 is a block schematic diagram of a circuit arrangement by means of which either (1) a filter 21 shown in FIG. 4 and having the filter coefficients as shown in FIG. 6 or FIG. 7, or (2) a filter as shown in FIG. 5 and having the filter coefficients as shown in FIG. 8, can be utilized.

FIG. 9 is the block schematic diagram of a circuit arrangement which can produce a filter 21 of the kind shown in FIG. 4 having the filter coefficients of FIG. 6 or FIG. 7, or a filter 21 of the kind shown in FIG. 5 having the filter coefficients of FIG. 8.

The input signal is supplied over a 6-bit bus 31 to the input of the filter of FIG. 9. The bus 31 is connected to the first input of an adder 411. The output thereof is connected by way of 7-bit buses 91–93 to a first address input of a PROM 321 and to the data output of a RAM 341. Operation of the RAM 341 is controlled by an address counter 94 whose output is connected by way of a 17-bit bus 95 to the address input of the RAM. The data input of RAM 341 is connected by way of 7-bit buses 96–98 to a first address input of a PROM 351 and to a first address input of a PROM 421. The output of the PROM 421 is fed back, being connected by way of a 7-bit bus 99 to a second input of the input adder 411.

The outputs of the respective PROMs 321, 351 are connected, in each case by way of a 7-bit bus 101, 102 respectively, to a first input and second input, respectively, of an adder 331. The output signal thereof is delivered by way of a 6-bit bus 36.

The PROMs 321, 351 and 421 are used as coefficient multipliers. Consequently, the follow coeffcients can, for example, be introduced at choice:

| PROM | Filter coefficient |
| --- | --- |
| 321 | B1 as shown in FIGS. 6, 7 or FIG. 8. |
| 351 | B2 as shown in FIGS. 6, 7 or 8. |
| 421 | A as shown in FIG. 8 or A = O. |

Each PROM 321, 351 and 421 contains 512 different addresses which are multiplexed by way of a 9-bit address bus. A word length of 7 bits is used as the first address set for each PROM in the FIG. 9 circuit.

Each PROM 321, 351 and 421 has a second address input. A control signal is supplied to each of the latter inputs in each case by way of a 2-bit bus 87, 88 and 89, respectively. This control signal selects the group of coefficients to be introduced by each PROM. Since the 2-bit control signal can have four different values, four different groups of filter coefficients per PROM and, therefore, four different filters, can be selected.

In the circuit arrangement of FIG. 9 the RAM 341 operates as a delay network. The image signal storage cells are disposed in the RAM 341 in a matrix containing 256 columns and 512 lines. This arrangement corresponds to the arrangement of the scanned dots and to the arrangement of the displayed image dots. Each image signal stored in the matrix has been encoded in the form of a 7-bit word.

The effect of the address counter 94 controlling the RAM 341 is that the same operates as a shift register. Consequently, the image signal for a scanned dot of the continuous scanning is present at the input of the RAM 341 simultaneously with the presence of the image signal for the same dot of the previous scan, at the output of the RAM 341.

I claim:

1. An image signal processing unit for use in a pulse echo ultrasonic imaging system utilizing consecutive, partly overlapping, line-wise scans to produce digital image signals corresponding to the received echoes, the scan lines comprising a predetermined number of scanning dots, and wherein the system includes an ultrasonic scanner; a transmitter connected thereto; a receiver connected to the ultrasonic scanner; a television monitor connected to the receiver and the television monitor; said receiver including a detector circuit and said image processing unit for producing an analog output signal representing the received echo; said image signal processing unit being characterized in that:
  (a) it is connected to be responsive to the output of the detector circuit;
  (b) it comprises: an analog-to-digital converter connected to be responsive to the output of the detector circuit; a digital image memory connected to be responsive to the output of the converter; a digital-to-analog converter connected to be responsive to the output of the image memory; and a non-linear digital filter having the structure of a transverse filter;
  (c) the filter is interposed between the analog-to-digital converter and the digital-to-analog converter and comprises at least one delay element for delaying the filter input signal for a period equal to the predetermined time interval between corresponding scanning dots of consecutive scans; and
  (d) the filter includes a coefficient B1 for filter signals not delayed in the filter and a coefficient B2 for filter input signals delayed in the filter, said coefficients B1 and B2 being defined by the following functions of the amplitude N of the input signal of the filter:
    (1) for relatively very low values of N in a range from N4 to N5: B1=B2=K3;
    (2) for relatively low and medium values of N in range between N5 and N7:
      B1 increases from B1=K3 with increasing N to reach a maximum B1=K4 when N=N6, thereafter decreasing with increasing N to equal K5 when N=N7; B2 decreases from B2=K3 with increasing N until reaching a minimum value B2=K6 when N=N6, B2=K6 being less than zero, then increasing with increasing N to equal K11 when N=N7, K11 being equal to or less than zero;
    (3) for relatively high values of N equal to or greater than N7: B1=K5 and B2=K11;
    (4) N4, N5, N6 and N7 are predetermined values of the amplitude N of the input signal and K3, K4, K5, K6 and K11 are fixed values.

2. An ultrasonic imaging system for producing ultrasonic cross-sectional images of a body using consecutive and at least partly overlapping, line-wise scans of the body by the pulse echo method in one scanning plane to produce digital image signals corresonding to the received echoes, said scan lines comprising predetermined numbers of scanning dots; said system comprising: an ultrasonic scanner; a transmitter connected thereto; a receiver connected to the ultrasonic scanner; a television monitor connected to the receiver; and a control unit connected to the transmitter, the receiver and the television monitor, the receiver comprising a detector circuit and an image processing unit for producing an analog output signal representing the received echo, characterized in that
  (a) the image processing unit is connected to be responsive to the output of the detector circuit;
  (b) the image processing unit comprises: an analog-to-digial converter connected to be responsive to the output of the detector circuit; a digital image memory connected to be responsive to the output of the converter; a digital-to-analog converter connected to be responsive to the output of the image memory; and a non-linear digital filter having the structure of a transverse filter;
  (c) the filter is interposed between the analog-to-digital converter and the digital-to-analog converter and comprises at least one delay element for delaying the filter input signal for a period equal to the predetermined time interval between corresponding scanning dots of consecutive scans; and
  (d) the filter includes a coefficient B1 for filter signals not delayed in the filter and a coefficient B2 for filter input signals delayed in the filter, said coefficients B1 and B2 being defined by the following functions of the amplitude N of the input signal of the filter:
    (1) for relatively very low values of N in a range from N4 to N5; B1=B2=K3;
    (2) for relatively low and medium values of N in range between N5 and N7;
      B1 increases from B1=K3 with increasing N to reach a maximum B1=K4 when N=N6, thereafter decreasing with increasing N to equal K5 when N=N7; B2 decreases from B2=K3 with increasing N until reaching a minimum value B2=K6 when N=N6, B2=K6 being less than zero, then increasing with increasing N to equal K11 when N=N7, K11 being equal to or less than zero;
    (3) for relatively high values of N equal to or greater than N7: B1=K5 and B2=K11; and
    (4) N4, N5, N6 and N7 are predetermined values of the amplitude N of the input signal and K3, K4, K5, K6 and K11 are fixed values.

* * * * *